United States Patent
Akagane

(10) Patent No.: US 9,172,027 B2
(45) Date of Patent: Oct. 27, 2015

(54) MANUFACTURING METHOD AND SYSTEM FOR AN ULTRASONIC GENERATING DEVICE THAT INCLUDES AN ATTACHMENT UNIT TO GENERATE AN ULTRASONIC VIBRATION

(71) Applicant: OLYMPUS MEDICAL SYSTEMS CORP., Tokyo (JP)

(72) Inventor: Tsunetaka Akagane, Hachioji (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/150,244

(22) PCT Filed: Apr. 8, 2013

(86) PCT No.: PCT/JP2013/060638
§ 371 (c)(1),
(2) Date: Apr. 14, 2014

(87) PCT Pub. No.: WO2013/157432
PCT Pub. Date: Oct. 24, 2013

(65) Prior Publication Data
US 2015/0026939 A1 Jan. 29, 2015

Related U.S. Application Data

(60) Provisional application No. 61/635,492, filed on Apr. 19, 2012.

(51) Int. Cl.
*H01L 41/08* (2006.01)
*H01L 41/25* (2013.01)
(Continued)

(52) U.S. Cl.
CPC .............. *H01L 41/25* (2013.01); *B06B 1/0611* (2013.01); *B60B 1/06* (2013.01)

(58) Field of Classification Search
CPC ........ B06B 1/0611; B06B 1/06; H01L 41/25; A61B 17/320068
USPC ........ 29/25.35, 592.1–594; 310/311; 600/443
See application file for complete search history.

(56) References Cited

U.S. PATENT DOCUMENTS

| 4,803,763 A * | 2/1989 | Eturo et al. ................. 29/25.35 |
| 2003/0084561 A1* | 5/2003 | Yamada .......................... 29/593 |

(Continued)

FOREIGN PATENT DOCUMENTS

| JP | A-64-36200 | 2/1989 |
| JP | A-4-304173 | 10/1992 |

(Continued)

OTHER PUBLICATIONS

International Search Report issued in International Patent Application No. PCT/JP2013/060638 dated Jul. 9, 2013 (with translation).

(Continued)

*Primary Examiner* — Minh Trinh
(74) *Attorney, Agent, or Firm* — Oliff PLC

(57) ABSTRACT

A manufacturing method of an ultrasonic generating device includes applying a compressive force to an attachment unit toward a first axial direction while a first end of a bolt-shaped member is a free end and the second end thereof is fixed, and thereby generating a first elastic force in the attachment unit. The manufacturing method includes attaching a fastening member to a bar portion of the bolt-shaped member in a balanced condition in which a second elastic force of the bolt-shaped member and the first elastic force are in balance, and thereby maintaining the balanced condition.

3 Claims, 9 Drawing Sheets

(51) Int. Cl.
*B06B 1/06* (2006.01)
*B60B 1/06* (2006.01)

(56) References Cited

U.S. PATENT DOCUMENTS

| | | | |
|---|---|---|---|
| 2011/0021916 A1* | 1/2011 | Morita | 600/443 |
| 2013/0212848 A1* | 8/2013 | Gabl | 29/25.35 |
| 2013/0274637 A1* | 10/2013 | Akagane | 601/2 |
| 2015/0026939 A1* | 1/2015 | Akagane | 29/25.35 |

FOREIGN PATENT DOCUMENTS

| | | |
|---|---|---|
| JP | A-9-176883 | 7/1997 |
| JP | A-2005-344869 | 12/2005 |

OTHER PUBLICATIONS

Oct. 30, 2014 International Preliminary Report on Patentability issued is International Application No. PCT/JP2013/060638.

* cited by examiner

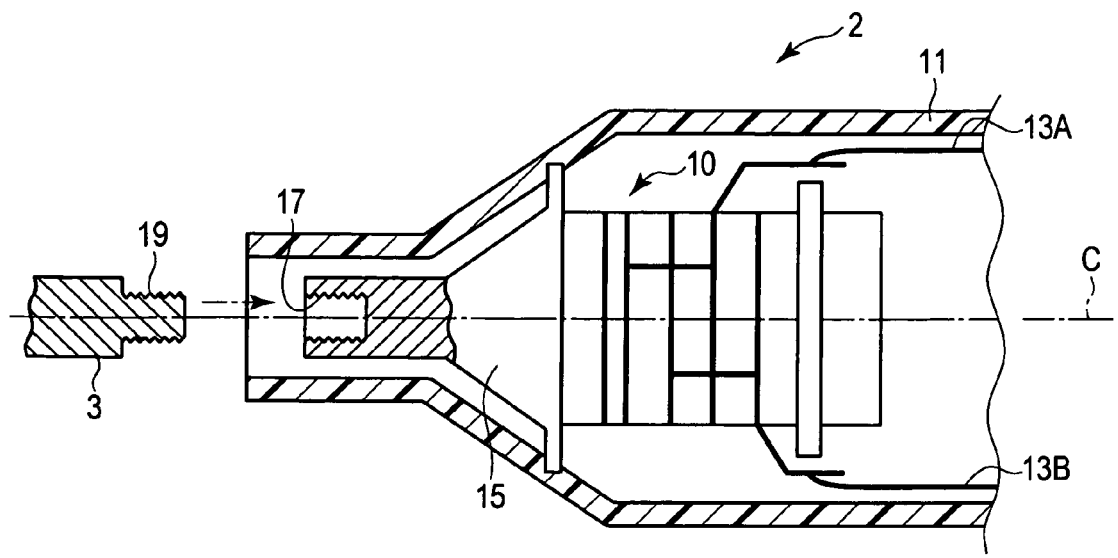
F I G. 2
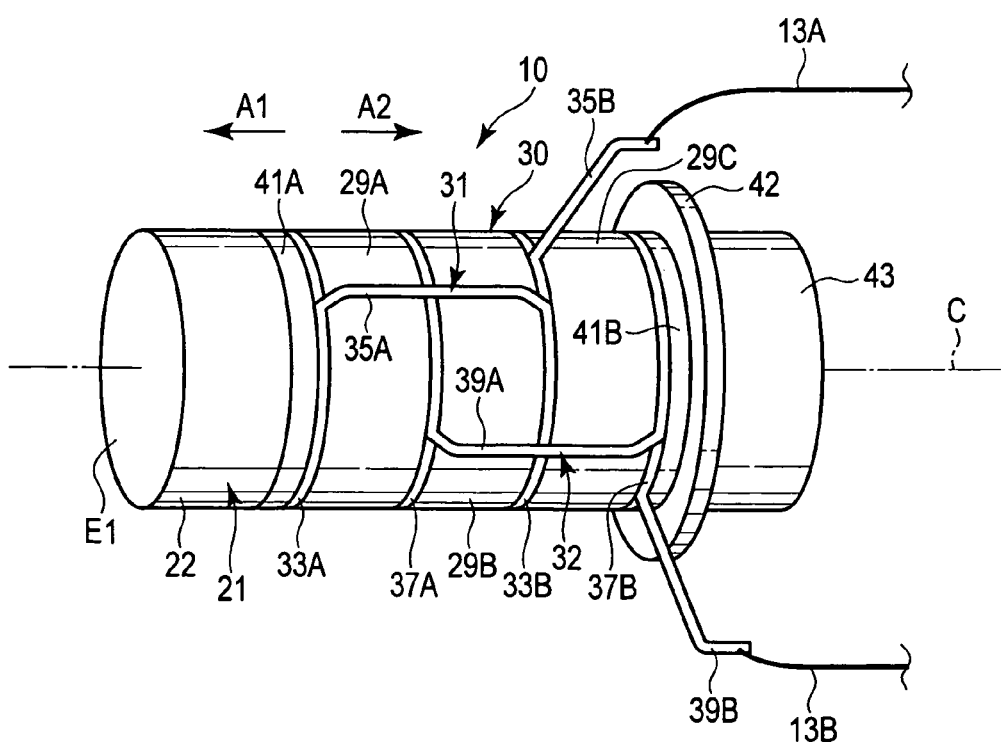
F I G. 3

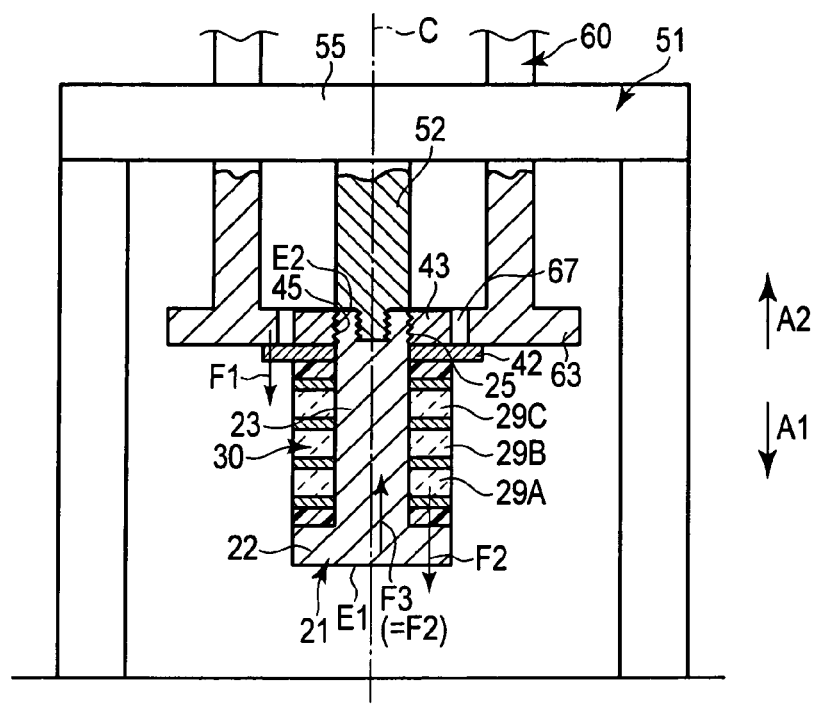
F I G. 10
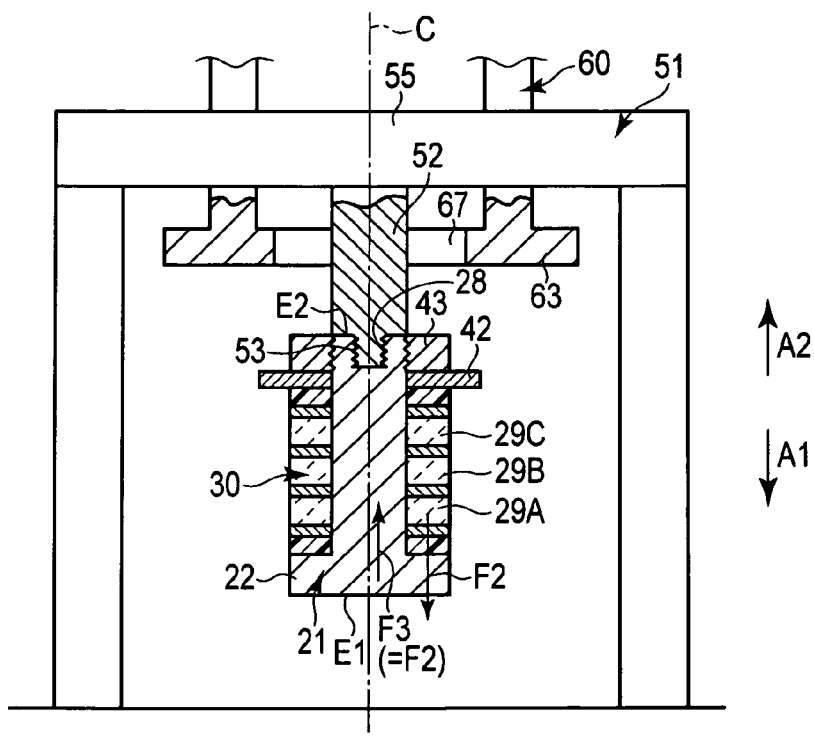
F I G. 11

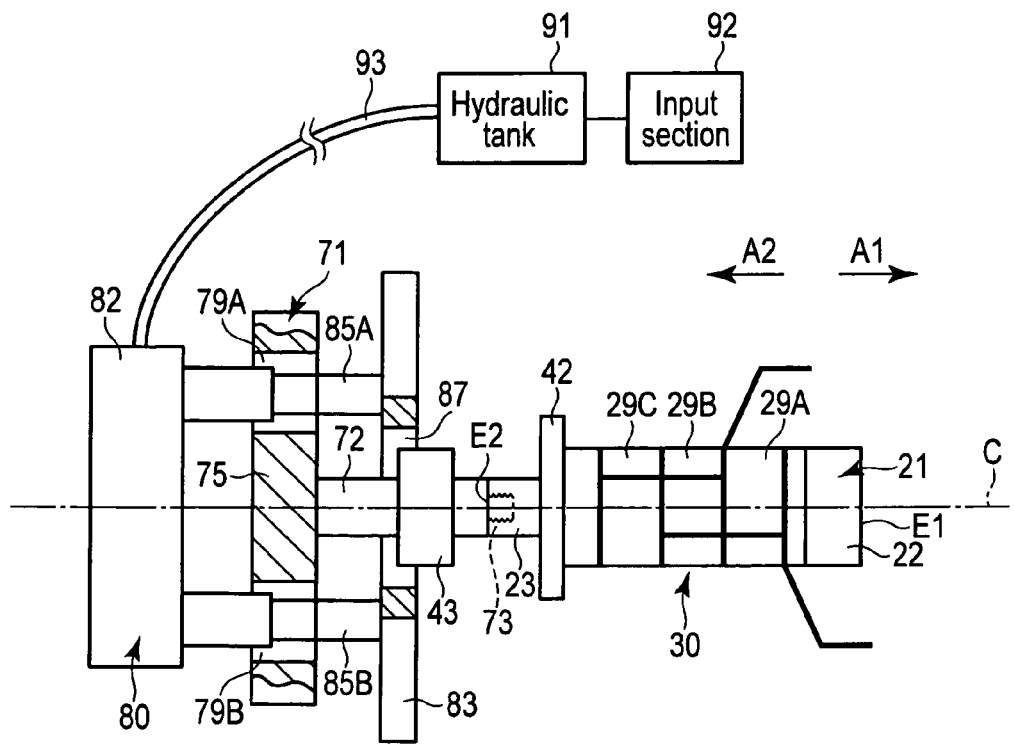
F I G. 12
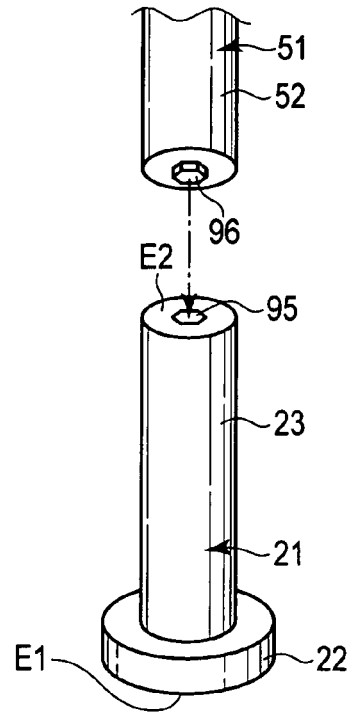
F I G. 13

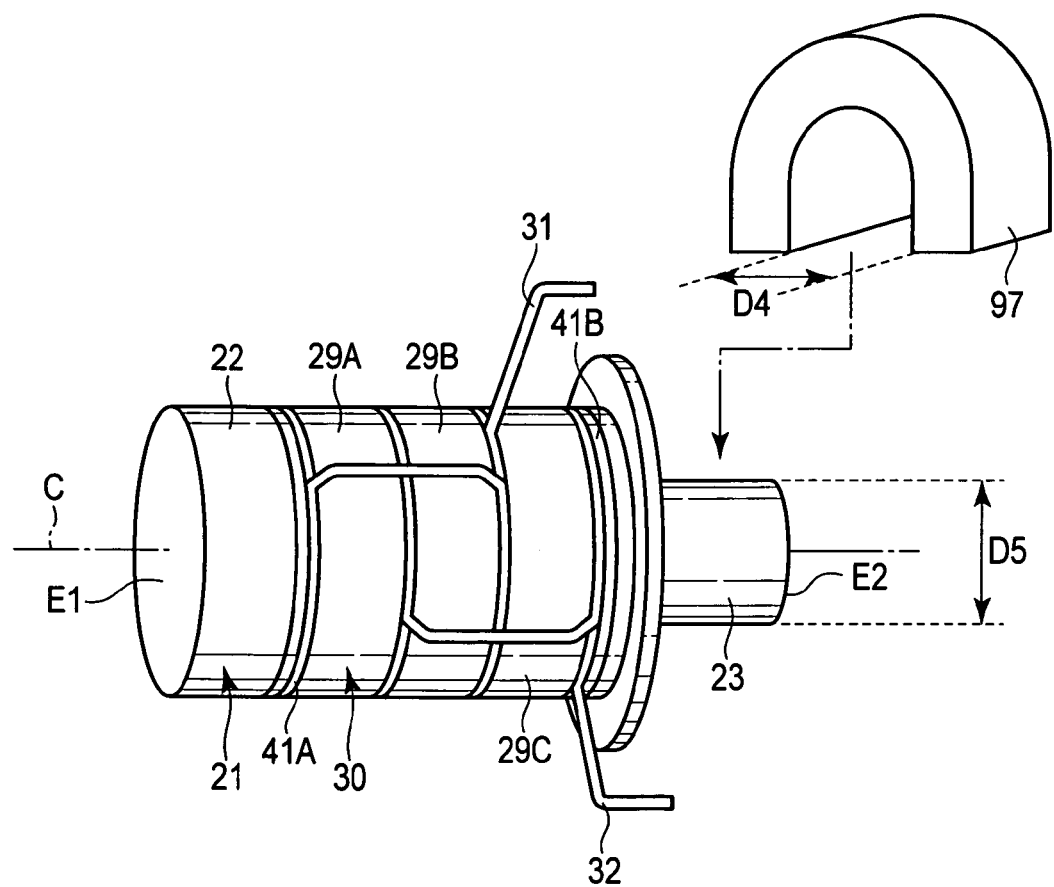
F I G. 14

MANUFACTURING METHOD AND SYSTEM FOR AN ULTRASONIC GENERATING DEVICE THAT INCLUDES AN ATTACHMENT UNIT TO GENERATE AN ULTRASONIC VIBRATION

CROSS-REFERENCE TO RELATED APPLICATIONS

This is a Continuation application of PCT Application No. PCT/JP2013/060638, filed Apr. 8, 2013 and based upon and claiming the benefit of priority from prior U.S. Provisional Application No. 61/635,492, filed Apr. 19, 2012, the entire contents of which are incorporated herein by reference.

BACKGROUND OF THE INVENTION

1. Field of the Invention

The present invention relates to a manufacturing method of an ultrasonic generating device which configured to generate an ultrasonic vibration when supplied with a current, and an assembling system of the ultrasonic generating device.

2. Description of the Related Art

Jpn. Pat. Appln. KOKAI Publication No. 64-36200 has disclosed an ultrasonic generating device which is configured to generate an ultrasonic vibration when supplied with a current. This ultrasonic generating device includes a bolt which includes a head portion, and a bar portion smaller in an outside diameter than the head portion. An attachment unit which includes piezoelectric elements configured to convert the current to the ultrasonic vibration is attached to the bar portion of the bolt. The attachment unit is fastened between the head portion of the bolt and a nut which is a fastening member, and is contracted. The piezoelectric element is contracted by the contraction of the attachment unit, and the conversion from the current to the ultrasonic vibration is properly performed by the piezoelectric elements.

In the manufacture of the ultrasonic generating device having the configuration described above, it is necessary to contract the attachment unit which includes the piezoelectric elements. In a general manufacturing method, the attachment unit is fastened by the nut to apply a compressive force to the attachment unit (piezoelectric elements) from the nut and contract the attachment unit. In the manufacturing method according to Jpn. Pat. Appln. KOKAI Publication No. 64-36200, a compressive force is applied to the attachment unit (piezoelectric elements) by a force applying unit separate from the nut to contract the attachment unit. When the attachment unit is contracted to a predetermined contraction state, the nut is attached to the bar portion of the bolt, and the attachment unit is fastened between the head portion of the bolt and the nut. As a result, the predetermined contraction state of the attachment unit is maintained. Here, when the compressive force is applied to the attachment unit from the force applying unit, both ends of the bolt are fixed in directions parallel to a longitudinal axis, and are fixed ends.

BRIEF SUMMARY OF THE INVENTION

According to one aspect of the invention, a manufacturing method of an ultrasonic generating device, the method including: attaching an attachment unit to a bar portion from a second axial direction side in a bolt-shaped member, the attachment unit including a piezoelectric element configured to convert a current to an ultrasonic vibration, a head portion forming a first end of the bolt-shaped member on a first axial direction side, the first axial direction being a direction parallel to a longitudinal axis, the bar portion smaller in an outside diameter than the head portion forming a second end of the bolt-shaped member on the second axial direction side, the second axial direction being opposite to the first axial direction; fixing, as a fixed end, the second end of the bolt-shaped member to which the attachment unit is attached, by using a bolt fixing portion of a jig, while the bolt-shaped member is expandable by a movement of the first end which is a free end toward the first axial direction; applying a compressive force to the attachment unit toward the first axial direction by a force applying unit while the second end of the bolt-shaped member is fixed, and thereby generating a first elastic force in the attachment unit; and attaching a fastening member to the bar portion of the bolt-shaped member in a balanced condition in which a second elastic force of the bolt-shaped member and the first elastic force of the attachment unit are in balance, and fastening the attachment unit between the fastening member and the head portion of the bolt-shaped member to maintain the balanced condition.

According to one another aspect of the invention, an assembling system of an ultrasonic generating device, the system including: a bolt-shaped member, the bolt-shaped member including a head portion forming a first end of the bolt-shaped member on a first axial direction side, the first axial direction being a direction parallel to a longitudinal axis, and a bar portion which is smaller in an outside diameter than the head portion and which forms a second end of the bolt-shaped member on the second axial direction side, the second axial direction being opposite to the first axial direction; an attachment unit which includes a piezoelectric element configured to convert a current to an ultrasonic vibration, and which is attached to the bar portion of the bolt-shaped member from the second axial direction side; a jig which includes a bolt-shaped member fixing portion, the bolt-shaped member fixing portion fixing, as a fixed end, the second end of the bolt-shaped member to which the attachment unit is attached while the bolt-shaped member is expandable by an movement of the first end which is a free end toward the first axial direction; a force applying unit which is configured to apply a compressive force to the attachment unit toward the first axial direction while the second end of the bolt-shaped member is fixed, and thereby generates a first elastic force in the attachment unit; and a fastening member which is attached to the bar portion of the bolt-shaped member in a balanced condition in which a second elastic force of the bolt-shaped member and the first elastic force of the attachment unit are in balance, and which is configured to fasten the attachment unit between the fastening member and the head portion of the bolt-shaped member to maintain the balanced condition.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a schematic sectional view showing a configuration of a vibration generating unit according to the first embodiment;

FIG. 3 is a schematic perspective view showing the configuration of an ultrasonic generating device according to the first embodiment;

FIG. 10 is a schematic diagram showing a state in which a nut is attached to a bar portion of the bolt-shaped member in the manufacture of the ultrasonic generating device according to the first embodiment;

FIG. 11 is a schematic diagram showing a state in which the application of the compressive force to the attachment unit by a force applying unit is stopped after the state in FIG. 10 in the manufacture of the ultrasonic generating device according to the first embodiment;

FIG. 12 is a schematic diagram showing the assembling system of the ultrasonic generating device according to a first modification;

FIG. 13 is a schematic perspective view showing the bolt-shaped member and a jig bar portion of the jig according to a second modification; and FIG. 14 is a schematic perspective view showing the configuration of the ultrasonic generating device according to a third modification.

DETAILED DESCRIPTION OF THE INVENTION

First Embodiment

Figure 1:
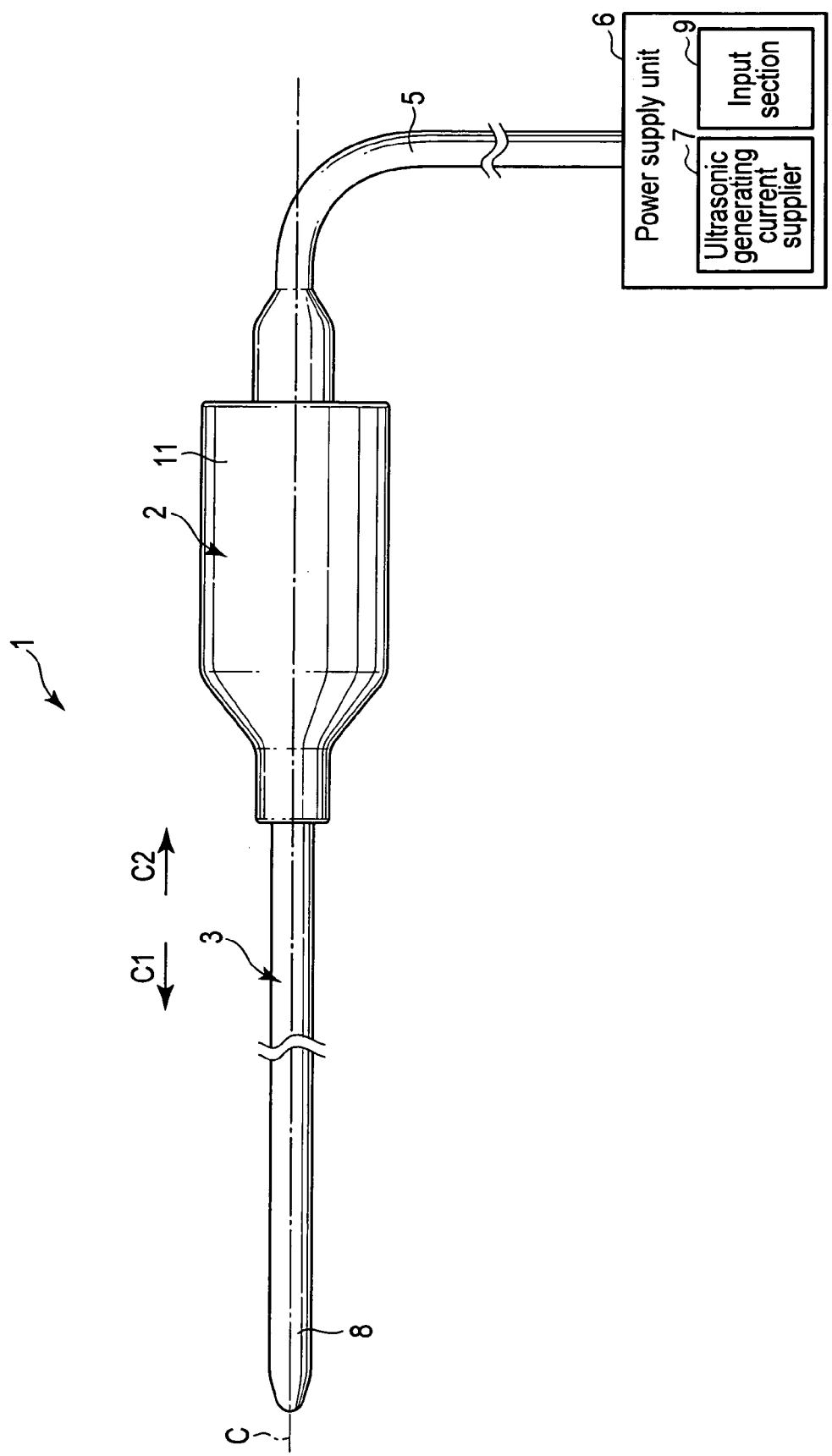
FIG. 1 is a schematic diagram showing an ultrasonic treatment device according to a first embodiment of the present invention.

A first embodiment of the present invention is described with reference to FIG. 1 to FIG. 6. FIG. 1 is a diagram showing an ultrasonic treatment device 1 according to the present embodiment. Here, the ultrasonic treatment device 1 is an example in which an ultrasonic generating device 10 described later is used. As shown in FIG. 1, the ultrasonic treatment device 1 has a longitudinal axis C. Here, one of two directions parallel to the longitudinal axis C is a distal direction (direction of an arrow C1 in FIG. 1), and a direction opposite to the distal direction is a proximal direction (direction of an arrow C2 in FIG. 1). The ultrasonic treatment device 1 includes a vibration generating unit 2, and an ultrasonic probe 3 which extends from a proximal end to a distal end thereof along the longitudinal axis C.

The vibration generating unit 2 includes a vibrator case 11. One end of a cable 5 is connected to a proximal end of the oscillator case 11. The other end of the cable 5 is connected to a power supply unit 6. The power supply unit 6 includes an ultrasonic generating current supplier 7 and an input section 9. A distal treatment section 8 is provided to a distal portion of the ultrasonic probe 3.

FIG. 2 is a diagram showing a configuration of the vibration generating unit 2. As shown in FIG. 2, the ultrasonic generating device 10 is provided inside the vibrator case 11. One end of each of electric wiring lines 13A and 13B is connected to the ultrasonic generating device 10. The other end of each of the electric wiring lines 13A and 13B is connected to the ultrasonic generating current supplier 7 of the power supply unit 6 through an inside of the cable 5. An ultrasonic vibration is generated in the ultrasonic generating device 10 by the supply of a current to the ultrasonic generating device 10 from the ultrasonic generating current supplier 7 via the electric wiring lines 13A and 13B. A horn 15 configured to increase the amplitude of the ultrasonic vibration is coupled to a distal direction side of the ultrasonic generating device 10. The horn 15 is attached to the transducer case 11. An internal thread portion 17 is formed in a distal portion of the horn 15.

An external thread portion 19 is formed in a proximal portion of the ultrasonic probe 3. The external thread portion 19 is threaded into the internal thread portion 17 of the horn 15, and the ultrasonic probe 3 is thereby attached to the vibration generating unit 2. When the ultrasonic probe 3 is attached to the vibration generating unit 2, the ultrasonic vibration generated in the ultrasonic generating device 10 is transmitted to the ultrasonic probe 3. When the ultrasonic vibration is transmitted to the distal treatment section 8 of the ultrasonic probe 3, the distal treatment section 8 treats a treatment target such as a living tissue by using the ultrasonic vibration. The ultrasonic vibration is a longitudinal vibration having vibration directions and a transmission direction parallel to the longitudinal axis C.

Figure 4:
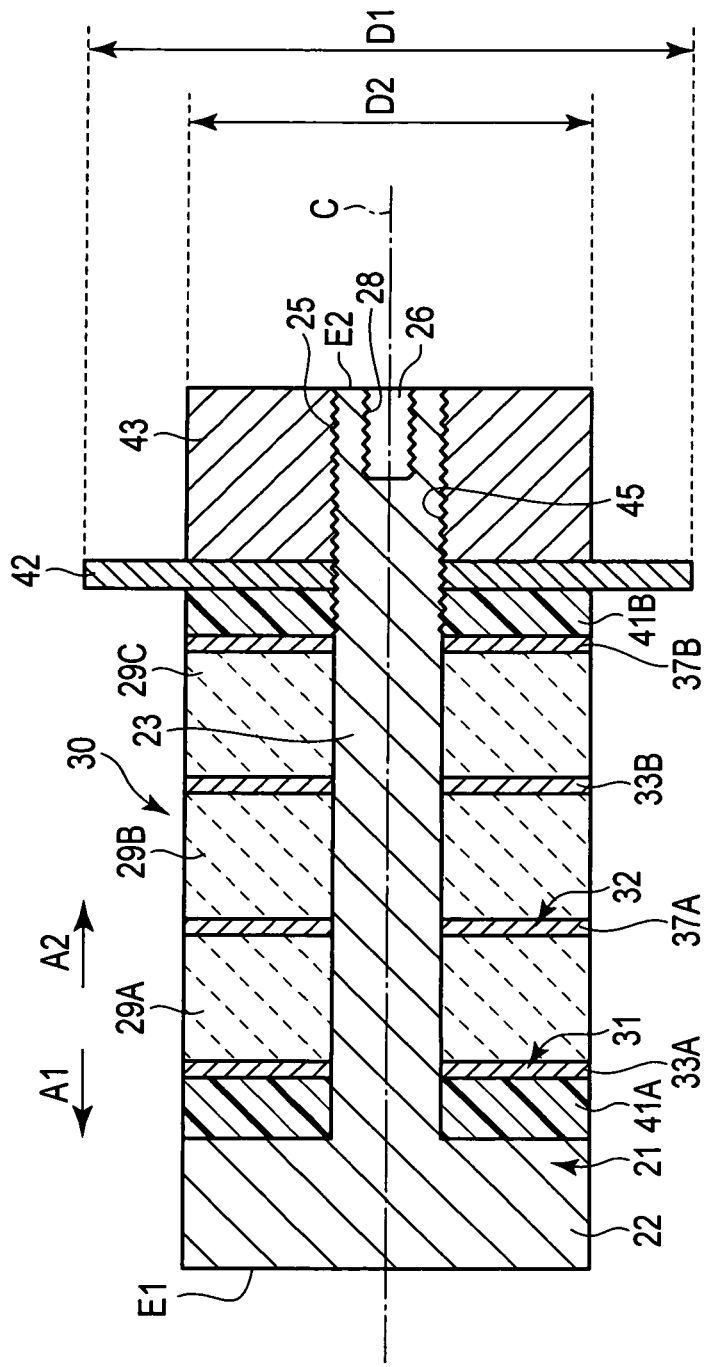
FIG. 4 is a schematic sectional view showing the configuration of the ultrasonic generating device according to the first embodiment.

FIG. 3 and FIG. 4 are diagrams showing a configuration of the ultrasonic generating device 10. As shown in FIG. 3 and FIG. 4, the ultrasonic generating device 10 includes a bolt-shaped member 21 as a holing member which is configured to hold an attachment unit 30 described later. The bolt-shaped member 21 includes a bar portion 23 as a shaft to which the attachment unit 30 is inserted and which extends parallel to the longitudinal axis C, and a head portion 22 as a regulating portion which is provided to one end portion of the bar portion 23 and which is configured to regulate the movement of the attachment unit 30 inserted to the bar portion 23. An outside diameter of the bar portion 23 is smaller than an outside diameter of the head portion 22. Longitudinal axis directions of the bolt-shaped member 21 correspond to the longitudinal axis C.

Here, in the ultrasonic generating device 10, one of directions parallel to the longitudinal axis C is a first axial direction (direction of an arrow A1 in FIG. 3 and FIG. 4), and a direction opposite to the first axial direction is a second axial direction (direction of an arrow A2 in FIG. 3 and FIG. 4).

In the bolt-shaped member 21, a first end E1 on the first axial direction side is formed by the head portion 22, and a second end E2 on the second axial direction side is formed by the bar portion 23.

In the bar portion 23, an external thread portion 25 is formed on an outer peripheral portion at an end portion on the second axial direction side. A depression 26 depressed toward the first axial direction is provided at the second end E2 of the bolt-shaped member 21. An internal thread portion 28 is formed in the concave portion 26.

The attachment unit 30 is attached to the bar portion 23 of the bolt-shaped member 21. The attachment unit 30 includes (three in the present embodiment) ring-shaped piezoelectric elements 29A to 29C. The piezoelectric elements 29A to 29C are made of, for example, ceramics. The attachment unit 30 also includes a first electrode 31 and a second electrode 32.

The first electrode 31 includes an electrode ring portion 33A located to the first axial direction side of the piezoelectric element 29A, and an electrode ring portion 33B located between the piezoelectric element 29B and the piezoelectric element 29C. The first electrode 31 also includes an electrode belt-shaped portion 35A continuing between the electrode ring portion 33A and the electrode ring portion 33B, and an electrode belt-shaped portion 35B which has one end continuing to the electrode ring portion 33B. One end of the electric wiring line 13A is connected to the electrode belt-shaped portion 35B of the first electrode 31.

The second electrode 32 includes an electrode ring portion 37A located between the piezoelectric element 29A and the piezoelectric element 29B, and an electrode ring portion 37B located to the second axial direction side of the piezoelectric element 29C. The second electrode 32 also includes an electrode belt-shaped portion 39A continuing between the electrode ring portion 37A and the electrode ring portion 37B, and an electrode belt-shaped portion 39B which has one end continuing to the electrode ring portion 37B. One end of the electric wiring line 13B is connected to the electrode belt-shaped portion 39B of the second electrode 32.

According to this configuration, a current (alternating current) is supplied to the first electrode 31 and the second electrode 32 from the ultrasonic generating current supplier 7 of the power supply unit 6. When the current is supplied to the first electrode 31 and the second electrode 32, the piezoelectric elements 29A to 29C convert the current to an ultrasonic vibration, and the ultrasonic vibration is generated.

The attachment unit 30 includes insulating rings 41A and 41B. The insulating ring 41A is located to the first axial direction side of the electrode ring portion 33A of the first electrode 31. The insulating ring 41B is located to the second axial direction side of the ring portion 37B of the second electrode 32. By the provision of the insulating ring 41A, the current supplied from the ultrasonic generating current supplier 7 is not transmitted toward the first axial direction side from the insulating ring 41A. By the provision of the insulating ring 41B, the current supplied from the ultrasonic generating current supplier 7 is not transmitted toward the second axial direction side from the insulating ring 41B. The attachment unit 30 also includes a washer 42 provided to the second axial direction side of the insulating ring 41B.

A nut 43 which is a fastening member is attached to the bar portion 23 of the bolt-shaped member 21 in addition to the attachment unit 30. The nut 43 is located to the second axial direction side of the attachment unit 30 (washer 42). An internal thread portion 45 is provided to the nut 43. When the internal thread portion 45 is threaded to the external thread portion 25 of the bar portion 23, the nut 43 is attached to the bar portion 23. By the provision of the nut 43, the attachment unit 30 (the piezoelectric elements 29A to 29C, the first electrode 31, the second electrode 32, the insulating rings 41A and 41B, and the washer 42) is fastened between the nut 43 and the head portion 22 of the bolt-shaped member 21. Therefore, the attachment unit 30 is fixed between the nut 43 and the head portion 22 of the bolt-shaped member 21. An outside diameter D1 of the washer 42 is larger than an outside diameter D2 of the nut 43.

Figure 5:
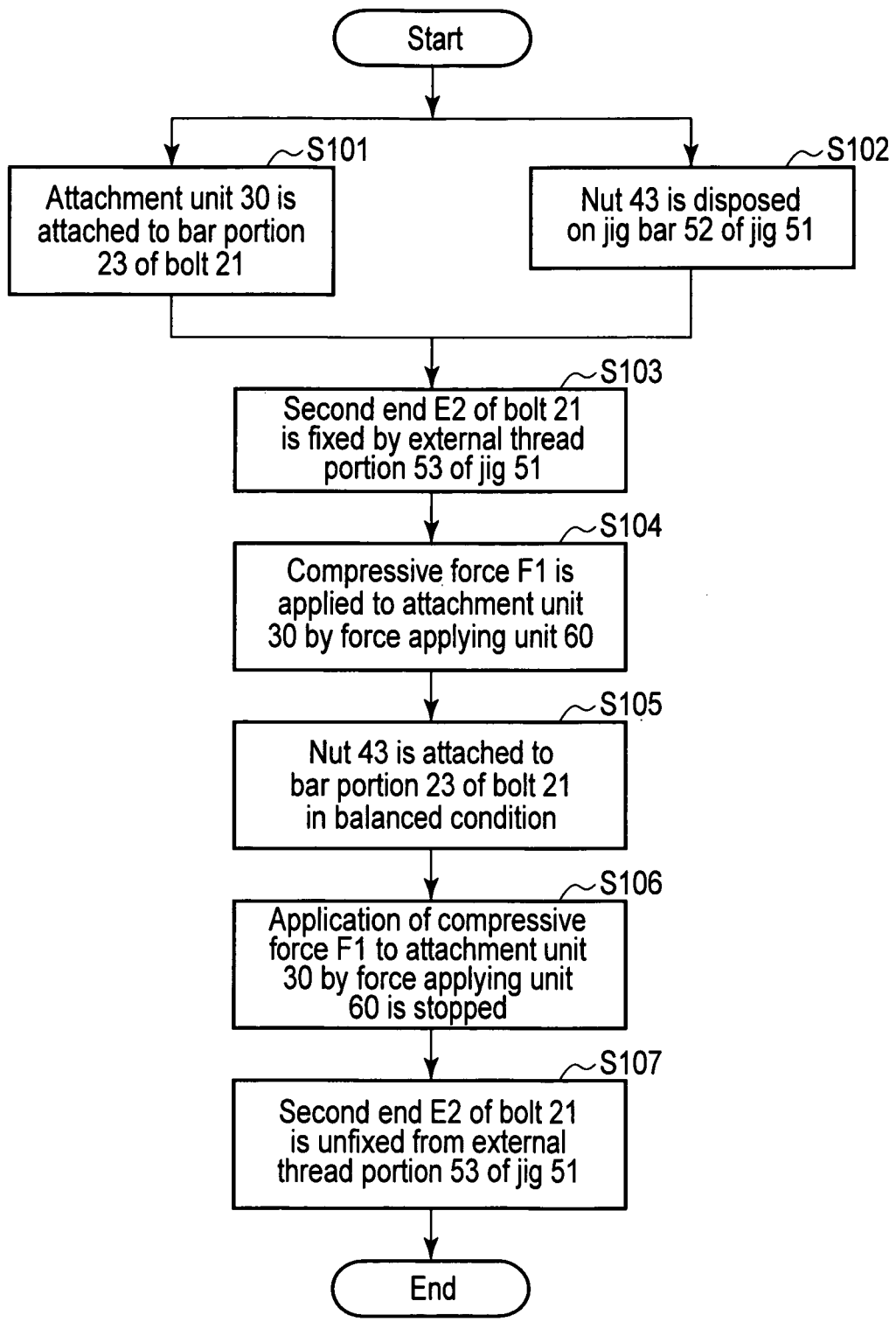
FIG. 5 is a flowchart showing a manufacturing method of the ultrasonic generating device according to the first embodiment.
Figure 6:
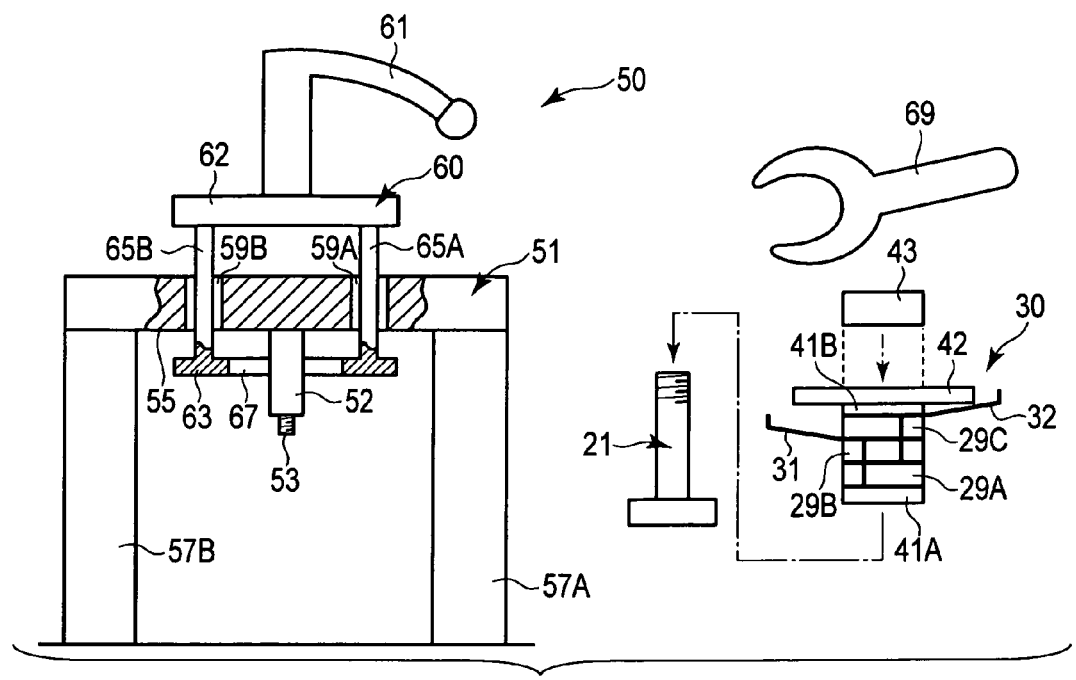
FIG. 6 is a schematic diagram showing an assembling system of the ultrasonic generating device for use in the manufacture of the ultrasonic generating device according to the first embodiment.

Now, a manufacturing method of the ultrasonic generating device 10 is described. FIG. 5 is a flowchart showing the manufacturing method of the ultrasonic generating device 10. FIG. 6 is a diagram showing an assembling system 50 of the ultrasonic generating device 10 for use in the manufacture of the ultrasonic generating device 10. As shown in FIG. 6, the assembling system 50 includes the above-mentioned bolt-shaped member 21, the attachment unit 30, and the nut 43 constituting the ultrasonic generating device 10.

The assembling system 50 also includes a jig 51. The jig 51 includes a seat 55, and legs 57A and 57B. The jig 51 is placed on the ground by the legs 57A and 57B. The jig 51 is provided with a jig bar portion 52 protruding toward a vertically downward direction from the seat 55. An external thread portion 53 is formed at a vertically-downward-direction-side end portion of the jig bar portion 52. Hole portions 59A and 59B which pass penetrate through the seat 55 in vertically upward-and-downward directions are provided in the seat 55.

The assembling system 50 includes a force applying unit 60. The force applying unit 60 includes an operation lever 61 located to the vertically upward direction side of the seat 55 of the jig 51. The operation lever 61 is connected to a plate-shaped portion 62. Link portions 65A and 65B extend toward the vertically downward direction from the plate-shaped portion 62. The link portion 65A extends toward the vertically downward direction side beyond the seat 55 through the hole portion 59A. Similarly, the link portion 65B extends toward the vertically downward direction side beyond the seat 55 through the hole portion 59B.

The link portions 65A and 65B are connected to a plate-shaped press portion 63 located to the vertically downward direction side of the seat 55. A hole portion 67 which penetrates through the press portion 63 in the vertically upward-and-downward directions is provided to the press portion 63. The jig bar portion 52 is inserted through the hole portion 67 of the press portion 63. According to this configuration described above, the force applying unit 60 can be moved relative to the jig 51 in the vertically upward-and-downward directions by the manual operation of the operation lever 61. The force applying unit 60 is supported by a support unit (not shown) with being movable in the vertically upward-and-downward directions.

Figure 7:
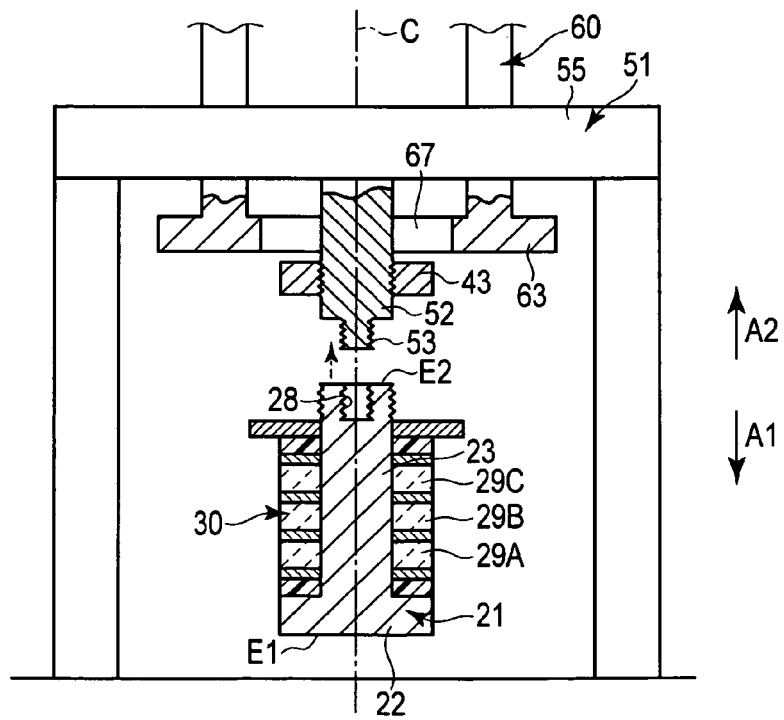
FIG. 7 is a schematic diagram showing a state before a second end of a bolt-shaped member is fixed by an external thread portion of a jig in the manufacture of the ultrasonic generating device according to the first embodiment.

The assembling system 50 also includes a spanner 69 as an attaching member used to attach the nut 43 to the bar portion 23 of the bolt-shaped member 21. When the nut 43 is attached to the bar portion 23, the spanner 69 is used to rotate the nut 43 relative to the bar portion 23. As shown in FIG. 5, when the ultrasonic generating device 10 is manufactured, the attachment unit 30 (the piezoelectric elements 29A to 29C, the first electrode 31, the second electrode 32, the insulating rings 41A and 41B, and the washer 42) is first attached to the bar portion 23 of the bolt-shaped member 21 (step S101). FIG. 7 is a diagram showing a state before the second end E2 of the bolt-shaped member 21 is fixed by the external thread portion 53 of the jig 51 in the manufacture of the ultrasonic generating device 10. As shown in FIG. 7, the bar portion 23 of the bolt-shaped member 21 is inserted through the attachment unit 30 including the piezoelectric elements 29A to 29C, and the attachment unit 30 is thereby attached to the bar portion 23. That is, the attachment unit 30 is attached to the bar portion 23 of the bolt-shaped member 21 from the second axial direction side.

Here, components constituting the attachment unit 30 such as the piezoelectric elements 29A to 29C, the first electrode 31, and the second electrode 32 are located at the above-mentioned positions. In the present embodiment, the first axial direction (direction of the arrow A1 in FIG. 7) corresponds to the vertically downward direction, and the second axial direction (direction of the arrow A2 in FIG. 7) corresponds to the vertically upward direction.

The nut 43 which is the fastening member is disposed on the jig bar portion 52 of the jig 51 (step S102) in simultaneous with the attachment of the attachment unit 30 to the bar portion 23 (step S101). As shown in FIG. 7, when the jig bar portion 52 is inserted through the nut 43, the nut 43 is disposed on the jig bar portion 52. That is, the nut 43 is disposed on the jig bar portion 52 from the first axial direction side. The external thread portion 53 is located at the end portion of the jig bar portion 52 on the first axial direction side.

Figure 8:
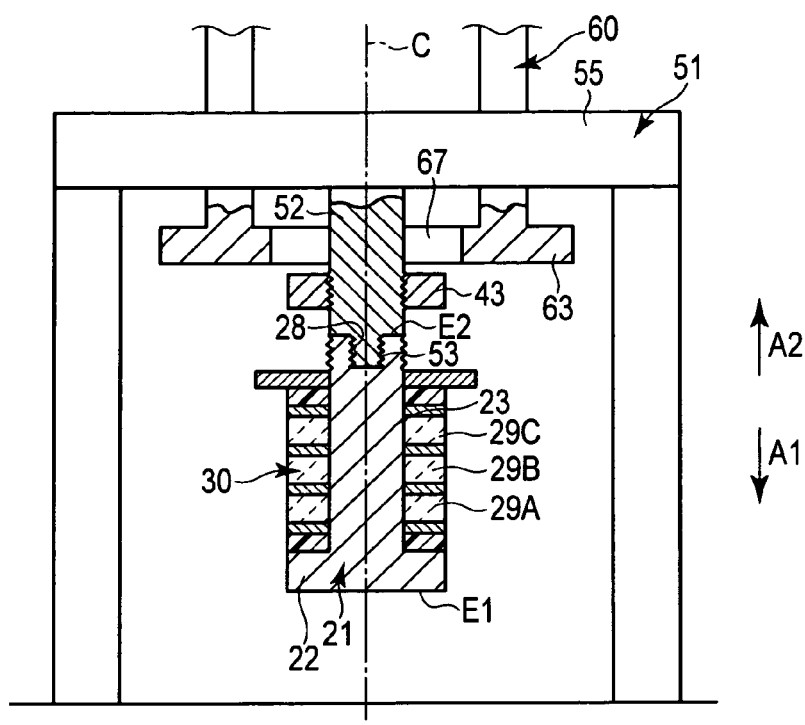
FIG. 8 is a schematic diagram showing a state in which the second end of the bolt-shaped member is fixed by the external thread portion of the jig in the manufacture of the ultrasonic generating device according to the first embodiment.

The second end E2 of the bolt-shaped member 21 is fixed as a fixed end by the external thread portion 53 of the jig 51 (step S103). FIG. 8 is a diagram showing a state in which the second end E2 of the bolt-shaped member 21 is fixed by the external thread portion 53 of the jig 51 in the manufacture of the ultrasonic generating device 10. As shown in FIG. 8, when the internal thread portion 28 of the bolt-shaped member 21 is threaded to the external thread portion 53 of the jig 51, the second end E2 of the bolt-shaped member 21 is fixed. That is, the external thread portion 53 of the jig 51 is a bolt-shaped member fixing portion (fixing portion) which fixes, as a fixed end, the second end E2 of the bolt-shaped member 21 to which the attachment unit 30 is attached.

Here, when the second end E2 of the bolt-shaped member 21 is fixed, the first end E1 of the bolt-shaped member 21 is a free end movable parallel to the longitudinal axis C. Thus, when, for example, an external force is applied to the bolt-shaped member 21 toward the first axial direction, the first end E1 as the free end moves toward the first axial direction. When the first end E1 moves toward the first axial direction while the second end E2 is fixed, the bolt-shaped member 21 stretches.

When the second end E2 of the bolt-shaped member 21 is fixed, the nut 43 is located in the jig bar portion 52 of the jig 51. That is, before the second end E2 of the bolt-shaped member 21 is fixed, the nut 43 is disposed on the jig bar portion 52 (step S102).

Figure 9:
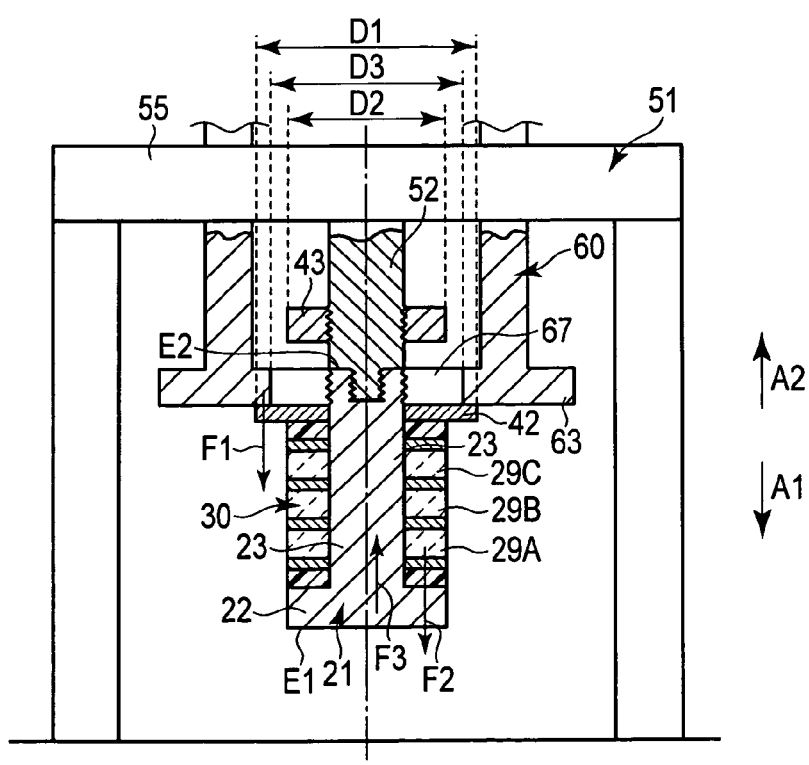
FIG. 9 is a schematic diagram showing a state in which the compressive force is applied to an attachment unit after the state in FIG. 8 in the manufacture of the ultrasonic generating device according to the first embodiment.

The force applying unit 60 is then moved toward the first axial direction (vertically downward direction), and a compressive force F1 is applied to the attachment unit 30 by the force applying unit 60 (step S104). FIG. 9 is a diagram showing a state in which the compressive force F1 is applied to the attachment unit 30 in the manufacture of the ultrasonic generating device 10. As shown in FIG. 9, an inside diameter D3 of the hole portion 67 formed in the press portion 63 of the force applying unit 60 is larger than the outside diameter D2 of the nut 43. Thus, when the force applying unit 60 moves toward the first axial direction (direction of the arrow A1 in FIG. 9), the press portion 63 does not contact the nut 43 located to the jig bar portion 52, and the press portion 63 moves toward the first axial direction side beyond the nut 43.

The inside diameter D3 of the hole portion 67 is smaller than the outside diameter D1 of the washer 42 of the attachment unit 30. Thus, the press portion 63 abuts on the washer 42 by the movement of the force applying unit 60 in the first axial direction. When the press portion 63 abuts on the washer 42, the compressive force F1 is applied to the attachment unit 30 from the force applying unit 60 toward the first axial direction. The attachment unit 30 including the piezoelectric elements 29A to 29C is contracted by the compressive force F1. A first elastic force F2 is generated in the attachment unit 30 by the contraction of the attachment unit 30.

The first elastic force F2 acts on the head portion 22 of the bolt-shaped member 21 from the attachment unit 30. Here, in the bolt-shaped member 21, the first end E1 is the free end, and the second end E2 is the fixed end. Thus, when the first elastic force F2 acts on the bolt-shaped member 21, the first end E1 moves toward the first axial direction, and the bolt-shaped member 21 expands.

A second elastic force F3 is generated in the bolt-shaped member 21 by the expansion of the bolt-shaped member 21. The second elastic force F3 acts toward a direction opposite to that of the first elastic force F2. The second elastic force F3 increases in accordance with the increase in the expansion amount of the bolt-shaped member 21. The bolt-shaped member 21 expands until the second elastic force F3 equals the first elastic force F2. That is, the bolt-shaped member 21 expands up to a balanced condition in which the first elastic force F2 and the second elastic force F3 are in balance. In the balanced condition, the bolt-shaped member 21 does not expand even if the compressive force F1 is applied to the attachment unit 30 by the force applying unit 60.

In the balanced condition, the nut 43 is attached to the bar portion 23 of the bolt-shaped member 21 (step S105). FIG. 10 is a diagram showing a state in which the nut 43 is attached to the bar portion 23 of the bolt-shaped member 21 in the manufacture of the ultrasonic generating device 10. As shown in FIG. 10, the nut 43 is attached while the compressive force F1 is being applied to the attachment unit 30 from the force applying unit 60. As a result, the balanced condition in which the first elastic force F2 and the second elastic force F3 are in balance is maintained when the nut 43 is attached.

When the nut 43 is attached to the bar portion 23, the spanner 69 is used to rotate the nut 43 relative to the bar portion 23. As a result, the nut 43 located in the jig bar portion 52 moves up to the bar portion 23 toward the first axial direction. When the internal thread portion 45 of the nut 43 is threaded to the external thread portion 25 of the bolt-shaped member 21, the nut 43 is attached to the bar portion 23 of the bolt-shaped member 21. The attachment unit 30 is fastened between the nut 43 and the head portion 22 of the bolt-shaped member 21 by the attachment of the nut 43. As a result, the balanced condition in which the first elastic force F2 and the second elastic force F3 are in balance is maintained. In other words, the nut 43 is attached so as to the bar portion 23 of the bolt-shaped member 21 to maintain the balanced condition of the first elastic force F2 and the second elastic force F3. The nut 43 is attached with a small fastening torque, and the fastening of the nut 43 prevents the attachment unit 30 from being further contracted from the balanced condition. The nut 43 may be manually rotated without the use of the spanner 69.

The application of the compressive force F1 to the attachment unit 30 by the force applying unit 60 is then stopped (step S106). FIG. 11 is a diagram showing a state in which the application of the compressive force F1 to the attachment unit 30 by the force applying unit 60 is stopped in the manufacture of the ultrasonic generating device 10. As shown in FIG. 11, after the nut 43 is attached to the bar portion 23 of the bolt-shaped member 21, the force applying unit 60 is moved toward the second axial direction (vertically upward direction). As a result, the press portion 63 of the force applying unit 60 is out of contact with the washer 42, and the application of the compressive force F1 to the attachment unit 30 from the force applying unit 60 is stopped.

Here, the attachment unit 30 including the piezoelectric elements 29A to 29C is fastened between the nut 43 and the head portion 22 of the bolt-shaped member 21 by the nut 43, and fixed between the nut 43 and the head portion 22. Thus, even if the compressive force F1 is not applied to the attachment unit 30 from the force applying unit 60, the balanced condition in which the first elastic force F2 and the second elastic force F3 are in balance is maintained.

The internal thread portion 28 of the bolt-shaped member 21 is then unthreaded from the external thread portion 53 of the jig 51. As a result, the second end E2 of the bolt-shaped member 21 is unfixed from the external thread portion 53 of the jig 51 (step S107). In this way, the ultrasonic generating device 10 is manufactured.

Accordingly, the following advantageous effects are provided by the manufacturing method of the ultrasonic generating device 10 and the assembling system 50 described above. That is, during the manufacture of the ultrasonic generating device 10, the compressive force F1 is applied to the attachment unit 30 including the piezoelectric elements 29A to 29C by the force applying unit 60 separate from the nut 43. Since the attachment unit 30 is not contracted by the fastening of the nut 43, the fastening torque of the nut 43, the characteristics of the bolt-shaped member 21, and the characteristics of the nut 43 have no influence on the contracted state of the attachment unit 30 (the piezoelectric elements 29A to 29C). Therefore, it is possible to effectively prevent the contracted state of the attachment units 30 from varying due to differences in the ultrasonic generating devices 10. This makes it possible to effectively prevent the vibration characteristics of the ultrasonic vibrations from varying due to differences in the ultrasonic generating devices 10, and prevent the vibration characteristics from varying under the influence of differences in the characteristics of the bolts.

During the manufacture of the ultrasonic generating device 10, the compressive force F1 is applied to the attachment unit 30 from the force applying unit 60 toward the first axial direction while the first end E1 of the bolt-shaped member 21 is a free end and the second end E2 of the bolt-shaped member 21 is the fixed end. Thus, the attachment unit 30 is contracted by the compressive force F1, so that the first elastic force F2 is generated in the attachment unit 30. The bolt-shaped member 21 is expanded by the first elastic force F2, and the second elastic force F3 which acts toward a direction opposite to the first elastic force F2 is generated in the bolt-shaped member 21. The bolt-shaped member 21 expands to the balanced condition in which the first elastic force F2 and the second elastic force F3 are in balance. In the balanced condition, the nut 43 is attached to the bar portion 23 of the bolt-shaped member 21, and the attachment unit 30 is fastened between the nut 43 and the head portion 22 of the bolt-shaped member 21. Thus, even if the application of the compressive force F1 to the attachment unit 30 is canceled, the balanced condition in which the first elastic force F2 and the second elastic force F3 are in balance is maintained. Since the ultrasonic generating device 10 is manufactured as described above, the first elastic force F2 and the second elastic force F3 are in balance at the completion of the ultrasonic generating device 10. Therefore, the expansion of the bolt-shaped member 21 caused by the first elastic force F2 is effectively prevented after the manufacture of the ultrasonic generating device 10. Consequently, it is possible to effectively prevent the vibration characteristic of the ultrasonic vibration of the manufactured ultrasonic generating device 10 from changing from the time of the completion of the ultrasonic generating device 10, and also effectively prevent the vibration characteristic from varying under the influence of the characteristic of the bolt.

(Modifications)

In the first embodiment, the second end E2 of the bolt-shaped member 21 is fixed as the fixed end while the first axial direction corresponds to the vertically downward direction and the second axial direction corresponds to the vertically upward direction. However, the present invention is not limited to this. Moreover, in the first embodiment, the operation lever 61 of the force applying unit 60 is manually operated to apply the compressive force F1 to the attachment unit 30 from the force applying unit 60. However, the present invention is not limited to this.

For example, as in a first modification shown in FIG. 12, the second end E2 of the bolt-shaped member 21 may be fixed as the fixed end while the first axial direction (direction of the arrow A1 in FIG. 12) and the second axial direction (direction of the arrow A2 in FIG. 12) are perpendicular to the vertical directions. In the present modification, a jig 71 is used instead of the jig 51. Moreover, in the present modification, the first axial direction is a first horizontal direction perpendicular to the vertical directions, and the second axial, direction is a second horizontal direction opposite to the first horizontal direction.

The jig 71 includes a seat 75, and a jig bar portion 72 protruding from the seat 75 toward the first axial direction (first horizontal direction). As in the first embodiment, the nut 43 which is the fastening member is disposed on the jig bar portion 72 before the second end E2 of the bolt-shaped member 21 is fixed. An external thread portion 73 is formed at an end portion of the jig bar portion 72 on the first axial direction side. As in the first embodiment, the external thread portion 73 is a fixing portion (bolt-shaped member fixing portion) which fixes the second end E2 of the bolt-shaped member 21 to which the attachment unit 30 is attached. When the second end E2 is fixed, the first end E1 of the bolt-shaped member 21 is a free end. Thus, when the second end E2 is fixed, the bolt-shaped member 21 can be expanded by the movement of the first end E1 toward the first axial direction. Hole portions 79A and 79B which pass through the seat 75 along the longitudinal axis C are provided to the seat 75.

In the present modification, a force applying unit 80 is used instead of the force applying unit 60. The force applying unit 80 includes a body portion 82 located to the second axial direction (second horizontal direction) side of the seat 75 of the jig 71. Expanding-and-contracting portions 85A and 85B extend from the body portion 82 toward the first axial direction. The telescopic portion 85A extends toward the first axial direction side beyond the seat 75 through the hole portion 79A. Similarly, the telescopic portion 85B extends toward the first axial direction side beyond the seat 75 through the hole portion 79B.

The telescopic portions 85A and 85B are connected to a plate-shaped press portion 83 located to the first axial direction side of the seat 75. A hole portion 87 which penetrates through the press portion 83 along the longitudinal axis C is provided in the press portion 83. The jig bar portion 72 is inserted through the hole portion 87 of the press portion 83. One end of a tube 93 is connected to the body portion 82 of the force applying unit 80. The other end of the tube 93 is connected to a hydraulic tank 91. The hydraulic tank 91 is electrically connected to an input section 92.

When the compressive force (F1) is applied to the attachment unit 30 by the force applying unit 80, oil is supplied to the telescopic portions 85A and 85B from the hydraulic tank 91 through the tube 93 and an inside of the body portion 82 by the operation in the input section 92. Then the press portion 83 is moved toward the first axial direction by the hydraulic expansion of the telescopic portions 85A and 85B, and the press portion 83 abuts on the washer 42. When the press portion 83 abuts on the washer 42, the compressive force (F1) is applied to the attachment unit 30 from the force applying unit 80 toward the first axial direction. Here, since the hole portion 87 is provided to the press portion 83, the press portion 83 does not contact the nut 43 located in the jig bar portion 72 when the press portion 83 moves toward the first axial direction. Thus, the press portion 83 is movable toward the first axial direction side beyond the nut 43.

As described above, according to the first modification, in the manufacture of the ultrasonic generating device 10, the compressive force (F1) has only to be applied to the attachment unit 30 from the force applying unit (60, 80) toward the first axial direction while the first end E1 of the bolt-shaped member 21 is the free end and the second end E2 is the fixed end. Thus, the attachment unit 30 is contracted, and the bolt-shaped member 21 is expanded by the first elastic force (F2) of the contracted attachment unit 30. The bolt-shaped member 21 expands up to the balanced condition in which the second elastic force (F3) of the expanded bolt-shaped member 21 and the first elastic force (F2) are in balance.

In the first embodiment, the second end E2 of the bolt-shaped member 21 is fixed as the fixed end when the internal thread portion 28 of the bolt-shaped member 21 is threaded to the external thread portion 53 of the jig 51. However, the present invention is not limited to this. For example, as in a second modification shown in FIG. 13, an engagement concave 95 depressed from the second end E2 of the bolt-shaped member 21 toward the first axial direction may be provided. The section of the engagement slot 95 is substantially hexagonally shaped. In the present modification, an engagement protrusion 96 is formed at the first-axial-direction-side end portion of the jig bar portion 52 of the jig 51. The section of the engagement protrusion 96 is substantially hexagonally shaped which is correspond to the engagement slot 95, and the engagement protrusion 96 can engage with the engagement slot 95. When the engagement protrusion 96 is engaged with the engagement slot 95, the second end E2 of the bolt-shaped member 21 is fixed as the fixed end. That is, the engagement protrusion 96 is a fixing portion which fixes, as a fixed end, the second end E2 of the bolt-shaped member 21 to which the attachment unit 30 is attached.

As described above, according to the second modification, the jig (51, 71) has only to be provided with the fixing portion (53, 73, 96) which fixes, as the fixed end, the second end E2 of the bolt-shaped member 21 to which the attachment unit 30 is attached.

In the first embodiment, the attachment unit 30 is fastened between the nut 43 and the head portion 22 of the bolt-shaped member 21 by the nut 43. However, the present invention is not limited to this. For example, as in a third modification shown in FIG. 14, a U-shaped member 97 may be used as the fastening member. The U-shaped member 97 is attached to the bar portion 23 of the bolt-shaped member 21 from one of directions perpendicular to the longitudinal axis C. A width D4 of a slot of the U-shaped member 97 is smaller than an outside diameter D5 of the bar portion 23. This ensures that the U-shaped member 97 is fixed to the bar portion 23 when the U-shaped member 97 is attached to the bar portion 23.

In the present modification, the U-shaped member 97 which is the fastening member is attached to the bar portion 23 in the balanced condition in which the first elastic force F2 of the attachment unit 30 and the second elastic force F3 of the bolt-shaped member 21 are in balance, as in the first embodiment. When the U-shaped member 97 is attached, the attachment unit 30 including the piezoelectric elements 29A to 29C is fastened between the U-shaped member 97 and the head portion 22 of the bolt-shaped member 21. Consequently, the balanced condition in which the first elastic force F2 and the second elastic force F3 are in balance is maintained.

In the present modification, since the U-shaped member 97 is attached to the bar portion from one of the directions perpendicular to the longitudinal axis C, it is not necessary to provide the jig bar portion (52, 72) in the jig (51, 71). That is, in contrast with the first embodiment, it is not necessary to dispose the fastening member (43) on the jig bar portion (52, 72) before the second end E2 of the bolt-shaped member 21 is fixed as the fixed end. Thus, the ultrasonic generating device 10 is more easily manufactured.

As described above, according to the third modification, in the manufacture of the ultrasonic generating device 10, the fastening member (43, 97) has only to be attached to the bar portion 23 of the bolt-shaped member 21 in the balanced condition in which the second elastic force F3 of the expanded bolt-shaped member 21 and the first elastic force F2 of the attachment unit 30 are in balance. Consequently, the attachment unit 30 is fastened between the fastening member (43, 97) and the head portion 22 of the bolt-shaped member 21, and the balanced condition is maintained.

In the first embodiment, the attachment unit 30 includes the piezoelectric elements 29A to 29C, the first electrode 31, the second electrode 32, the insulating rings 41A and 41B, and the washer 42. However, the present invention is not limited to this. For example, no insulating rings 41A and 41B may be provided, and four piezoelectric elements (29A to 29C) may be provided. That is, the attachment unit 30 has only to include at least one piezoelectric element (29A to 29C).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of an ultrasonic generating device, the method comprising:
   attaching an attachment unit to a bar portion from a second axial direction side in a bolt-shaped member, the attachment unit including a piezoelectric element configured to convert a current to an ultrasonic vibration, a head portion forming a first end of the bolt-shaped member on a first axial direction side, the first axial direction being a direction parallel to a longitudinal axis, the bar portion smaller in an outside diameter than the head portion forming a second end of the bolt-shaped member on the second axial direction side, the second axial direction being opposite to the first axial direction;
   fixing, as a fixed end, the second end of the bolt-shaped member to which the attachment unit is attached, by using a bolt fixing portion of a jig, while the bolt-shaped member is expandable by a movement of the first end which is a free end toward the first axial direction;
   applying a compressive force to the attachment unit toward the first axial direction by a force applying unit while the second end of the bolt-shaped member is fixed, and thereby generating a first elastic force in the attachment unit; and
   attaching a fastening member to the bar portion of the bolt-shaped member in a balanced condition in which a second elastic force of the bolt-shaped member and the first elastic force of the attachment unit are in balance, and fastening the attachment unit between the fastening member and the head portion of the bolt-shaped member to maintain the balanced condition.

2. The manufacturing method according to claim 1, wherein the applying the compressive force to the attachment unit by the force applying unit includes contracting the attachment unit by the compressive force, expanding the bolt-shaped member by the first elastic force of the contracted attachment unit, and generating the second elastic force in the expanded bolt-shaped member.

3. The manufacturing method according to claim 1, further comprising disposing the fastening member on a jig bar portion in which the bolt fixing portion is provided at an end portion on the first axial direction side, before the second end of the bolt-shaped member is fixed, wherein the attaching the fastening member to the bar portion of the bolt-shaped member includes moving the fastening member from the jig bar portion to the bar portion of the bolt-shaped member toward the first axial direction in the balanced condition.

* * * * *